United States Patent
Weng et al.

(10) Patent No.: US 8,198,131 B2
(45) Date of Patent: Jun. 12, 2012

(54) STACKABLE SEMICONDUCTOR DEVICE PACKAGES

(75) Inventors: Cheng-Yi Weng, Kaohsiung (TW); Chi-Chih Chu, Kaohsiung (TW); Chien-Yuan Tseng, Kaohsiung (TW)

(73) Assignee: Advanced Semiconductor Engineering, Inc., Kaosiung (TW)

( * ) Notice: Subject to any disclaimer, the term of this patent is extended or adjusted under 35 U.S.C. 154(b) by 141 days.

(21) Appl. No.: 12/846,630

(22) Filed: Jul. 29, 2010

(65) Prior Publication Data

US 2011/0117700 A1  May 19, 2011

Related U.S. Application Data

(60) Provisional application No. 61/262,513, filed on Nov. 18, 2009.

(51) Int. Cl.
*H01L 21/02* (2006.01)

(52) U.S. Cl. ........ 438/107; 438/108; 438/119; 438/611; 438/613; 438/615; 257/E21.503; 257/E21.511; 257/E23.067; 257/E23.069; 257/E25.013; 257/E25.023; 257/E31.127

(58) Field of Classification Search .......... 438/107–119, 438/611–615; 257/E21.503, 511, 23.021, 257/67–69, 92, 25.013–23, 31.127
See application file for complete search history.

(56) References Cited

U.S. PATENT DOCUMENTS

| | | | |
|---|---|---|---|
| 5,072,289 A * | 12/1991 | Sugimoto et al. | 257/737 |
| 5,128,831 A | 7/1992 | Fox, III et al. | |
| 5,139,610 A * | 8/1992 | Dunaway et al. | 438/674 |
| 5,207,585 A * | 5/1993 | Byrnes et al. | 439/66 |
| 5,222,014 A | 6/1993 | Lin | |
| 5,355,580 A | 10/1994 | Tsukada | |
| 5,397,997 A * | 3/1995 | Tuckerman et al. | 324/750.09 |
| 5,400,948 A | 3/1995 | Sajja et al. | |
| 5,468,681 A * | 11/1995 | Pasch | 438/108 |
| 5,579,207 A | 11/1996 | Hayden et al. | |
| 5,594,275 A | 1/1997 | Kwon et al. | |
| 5,608,265 A | 3/1997 | Kitano et al. | |

(Continued)

FOREIGN PATENT DOCUMENTS

JP  07335783  12/1995

(Continued)

OTHER PUBLICATIONS

Yoshida et al., A Study on Package Stacking Process for Package-on-Package (PoP) Electronic Components and Tech. Conf. (ECTC), May 2006, San Diego, CA.

(Continued)

*Primary Examiner* — Michael Lebentritt
(74) *Attorney, Agent, or Firm* — Foley & Lardner LLP

(57) ABSTRACT

Described herein are stackable semiconductor device packages and related stacked package assemblies and methods. In one embodiment, a manufacturing method includes: (1) providing a substrate including contact pads disposed adjacent to an upper surface of the substrate; (2) applying an electrically conductive material to form conductive bumps disposed adjacent to respective ones of the contact pads; (3) electrically connecting a semiconductor device to the upper surface of the substrate; (4) applying a molding material to form a molded structure covering the conductive bumps and the semiconductor device; (5) forming a set of cutting slits extending partially through the molded structure and the conductive bumps to form truncated conductive bumps; and (6) reflowing the truncated conductive bumps to form reflowed conductive bumps.

20 Claims, 7 Drawing Sheets

U.S. PATENT DOCUMENTS

| | | | |
|---|---|---|---|
| 5,714,800 | A | 2/1998 | Thompson |
| 5,726,493 | A | 3/1998 | Yamashita et al. |
| 5,748,452 | A | 5/1998 | Londa |
| 5,763,939 | A | 6/1998 | Yamashita |
| 5,844,315 | A | 12/1998 | Melton et al. |
| 5,861,666 | A | 1/1999 | Bellaar |
| 5,883,426 | A | 3/1999 | Tokuno et al. |
| 5,889,327 | A * | 3/1999 | Washida et al. ............... 257/737 |
| 5,889,655 | A | 3/1999 | Barrow |
| 5,892,290 | A | 4/1999 | Chakravorty et al. |
| 5,929,521 | A * | 7/1999 | Wark et al. .................... 257/737 |
| 5,973,393 | A | 10/1999 | Chia et al. |
| 5,985,695 | A | 11/1999 | Freyman et al. |
| 6,072,236 | A * | 6/2000 | Akram et al. .................. 257/698 |
| 6,177,724 | B1 | 1/2001 | Sawai |
| 6,194,250 | B1 | 2/2001 | Melton et al. |
| 6,195,268 | B1 | 2/2001 | Eide |
| 6,303,997 | B1 | 10/2001 | Lee |
| 6,448,665 | B1 * | 9/2002 | Nakazawa et al. ............ 257/789 |
| 6,451,624 | B1 | 9/2002 | Farnworth et al. |
| 6,461,881 | B1 * | 10/2002 | Farnworth et al. ............. 438/15 |
| 6,489,676 | B2 | 12/2002 | Taniguchi et al. |
| 6,501,165 | B1 | 12/2002 | Farnworth et al. |
| 6,513,236 | B2 * | 2/2003 | Tsukamoto .................... 29/846 |
| 6,521,995 | B1 * | 2/2003 | Akram et al. .................. 257/737 |
| 6,525,413 | B1 * | 2/2003 | Cloud et al. ................... 257/686 |
| 6,614,104 | B2 | 9/2003 | Farnworth et al. |
| 6,617,687 | B2 * | 9/2003 | Akram et al. .................. 257/737 |
| 6,740,546 | B2 | 5/2004 | Corisis et al. |
| 6,740,964 | B2 | 5/2004 | Sasaki |
| 6,780,746 | B2 * | 8/2004 | Kinsman et al. .............. 438/612 |
| 6,787,392 | B2 | 9/2004 | Quah |
| 6,798,057 | B2 | 9/2004 | Bolkin et al. |
| 6,812,066 | B2 | 11/2004 | Taniguchi et al. |
| 6,815,254 | B2 | 11/2004 | Mistry et al. |
| 6,828,665 | B2 | 12/2004 | Pu et al. |
| 6,847,109 | B2 | 1/2005 | Shim |
| 6,861,288 | B2 | 3/2005 | Shim et al. |
| 6,888,255 | B2 | 5/2005 | Murtuza et al. |
| 6,924,550 | B2 | 8/2005 | Corisis et al. |
| 6,936,930 | B2 | 8/2005 | Wang |
| 6,974,334 | B2 | 12/2005 | Hung |
| 7,002,805 | B2 | 2/2006 | Lee |
| 7,015,571 | B2 | 3/2006 | Chang et al. |
| 7,026,709 | B2 | 4/2006 | Tsai et al. |
| 7,029,953 | B2 | 4/2006 | Sasaki |
| 7,034,386 | B2 | 4/2006 | Kurita |
| 7,049,692 | B2 | 5/2006 | Nishimura et al. |
| 7,061,079 | B2 | 6/2006 | Weng et al. |
| 7,071,028 | B2 | 7/2006 | Koike et al. |
| 7,129,576 | B2 * | 10/2006 | Humpston .................... 257/704 |
| 7,185,426 | B1 | 3/2007 | Hiner et al. |
| 7,187,068 | B2 | 3/2007 | Suh et al. |
| 7,221,045 | B2 * | 5/2007 | Park et al. .................... 257/676 |
| 7,242,081 | B1 | 7/2007 | Lee |
| 7,262,080 | B2 | 8/2007 | Go et al. |
| 7,279,784 | B2 | 10/2007 | Liu |
| 7,279,789 | B2 | 10/2007 | Cheng |
| 7,288,835 | B2 | 10/2007 | Yim et al. |
| 7,309,913 | B2 | 12/2007 | Shim et al. |
| 7,345,361 | B2 | 3/2008 | Mallik et al. |
| 7,354,800 | B2 | 4/2008 | Carson |
| 7,364,945 | B2 | 4/2008 | Shim et al. |
| 7,364,948 | B2 | 4/2008 | Lai et al. |
| 7,365,427 | B2 | 4/2008 | Lu et al. |
| 7,372,141 | B2 | 5/2008 | Karnezos et al. |
| 7,372,151 | B1 | 5/2008 | Fan et al. |
| 7,394,663 | B2 * | 7/2008 | Yamashita et al. ............ 361/766 |
| 7,408,244 | B2 | 8/2008 | Lee et al. |
| 7,417,329 | B2 | 8/2008 | Chuang et al. |
| 7,429,786 | B2 | 9/2008 | Karnezos et al. |
| 7,429,787 | B2 | 9/2008 | Karnezos et al. |
| 7,436,055 | B2 | 10/2008 | Hu |
| 7,436,074 | B2 | 10/2008 | Pan et al. |
| 7,473,629 | B2 | 1/2009 | Tai et al. |
| 7,485,970 | B2 | 2/2009 | Hsu et al. |
| 7,550,832 | B2 | 6/2009 | Weng et al. |
| 7,550,836 | B2 | 6/2009 | Chou et al. |
| 7,560,818 | B2 | 7/2009 | Tsai |
| 7,586,184 | B2 | 9/2009 | Hung et al. |
| 7,589,408 | B2 | 9/2009 | Weng et al. |
| 7,633,765 | B1 | 12/2009 | Scanlon et al. |
| 7,642,133 | B2 | 1/2010 | Wu et al. |
| 7,671,457 | B1 | 3/2010 | Hiner et al. |
| 7,719,094 | B2 | 5/2010 | Wu et al. |
| 7,723,839 | B2 | 5/2010 | Yano et al. |
| 7,728,431 | B2 * | 6/2010 | Harada et al. ................. 257/750 |
| 7,737,539 | B2 | 6/2010 | Kwon et al. |
| 7,737,565 | B2 | 6/2010 | Coffy |
| 7,777,351 | B1 | 8/2010 | Berry et al. |
| 7,838,334 | B2 | 11/2010 | Yu et al. |
| 2003/0129272 | A1 | 7/2003 | Shen et al. |
| 2004/0106232 | A1 | 6/2004 | Sakuyama et al. |
| 2004/0126927 | A1 | 7/2004 | Lin et al. |
| 2004/0191955 | A1 | 9/2004 | Joshi et al. |
| 2005/0054187 | A1 | 3/2005 | Ding et al. |
| 2005/0117835 | A1 | 6/2005 | Nguyen et al. |
| 2005/0121764 | A1 | 6/2005 | Mallik |
| 2006/0035409 | A1 | 2/2006 | Suh et al. |
| 2006/0170112 | A1 | 8/2006 | Tanaka et al. |
| 2006/0220210 | A1 | 10/2006 | Karnezos et al. |
| 2006/0240595 | A1 | 10/2006 | Lee |
| 2006/0244117 | A1 | 11/2006 | Karnezos et al. |
| 2007/0029668 | A1 | 2/2007 | Lin et al. |
| 2007/0090508 | A1 | 4/2007 | Lin et al. |
| 2007/0108583 | A1 | 5/2007 | Shim et al. |
| 2007/0241453 | A1 | 10/2007 | Ha et al. |
| 2007/0273049 | A1 | 11/2007 | Khan et al. |
| 2007/0290376 | A1 | 12/2007 | Zhao et al. |
| 2008/0017968 | A1 | 1/2008 | Choi et al. |
| 2008/0073769 | A1 | 3/2008 | Wu et al. |
| 2008/0230887 | A1 | 9/2008 | Sun et al. |
| 2010/0000775 | A1 | 1/2010 | Shen et al. |
| 2010/0032821 | A1 | 2/2010 | Pagaila et al. |
| 2010/0171205 | A1 | 7/2010 | Chen et al. |
| 2010/0171206 | A1 | 7/2010 | Chu et al. |
| 2010/0171207 | A1 | 7/2010 | Shen et al. |
| 2011/0049704 | A1 | 3/2011 | Sun et al. |
| 2011/0156251 | A1 | 6/2011 | Chu et al. |

FOREIGN PATENT DOCUMENTS

| | | |
|---|---|---|
| JP | 2000294720 | 10/2000 |
| JP | 2001298115 | 10/2001 |
| JP | 2002158312 | 5/2002 |
| JP | 2002170906 | 6/2002 |
| JP | 2004327855 | 11/2004 |
| JP | 2009054686 | 3/2009 |
| KR | 20020043435 | 6/2002 |
| KR | 20030001963 | 1/2003 |
| TW | 529155 | 4/2003 |
| TW | 229927 | 3/2005 |
| TW | 200611305 | 4/2006 |

OTHER PUBLICATIONS

Dreiza et al., "High Density PoP (Package-on-Package) and Package Stacking Development" Electronic Components and Technology Conf. (May 2007).

* cited by examiner

STACKABLE SEMICONDUCTOR DEVICE PACKAGES

CROSS REFERENCE TO RELATED APPLICATION

This application claims the benefit of U.S. Provisional Application Ser. No. 61/262,513, filed on Nov. 18, 2009, the disclosure of which is incorporated herein by reference in its entirety.

FIELD OF THE INVENTION

The invention relates generally to semiconductor device packages. More particularly, the invention relates to stackable semiconductor device packages.

BACKGROUND

Electronic products have become progressively more complex, driven at least in part by the demand for enhanced functionality and smaller sizes. While the benefits of enhanced functionality and smaller sizes are apparent, achieving these benefits also can create problems. In particular, electronic products typically have to accommodate a high density of semiconductor devices in a limited space. For example, the space available for processors, memory devices, and other active or passive devices can be rather limited in cell phones, personal digital assistants, laptop computers, and other portable consumer products. In conjunction, semiconductor devices are typically packaged in a fashion to provide protection against environmental conditions as well as to provide input and output electrical connections. Packaging of semiconductor devices within semiconductor device packages can take up additional valuable space within electronic products. As such, there is a strong drive towards reducing footprint areas taken up by semiconductor device packages. One approach along this regard is to stack semiconductor device packages on top of one another to form a stacked package assembly, which is also sometimes referred as a package-on-package ("PoP") assembly.

FIG. 1 illustrates a stacked package assembly 100 implemented in accordance with a conventional approach, in which a top package 102 is disposed above and electrically connected to a bottom package 104. The top package 102 includes a substrate unit 106 and a semiconductor device 108, which is disposed on an upper surface 118 of the substrate unit 106. The top package 102 also includes a package body 110 that covers the semiconductor device 108. Similarly, the bottom package 104 includes a substrate unit 112, a semiconductor device 114, which is disposed on an upper surface 120 of the substrate unit 112, and a package body 116, which covers the semiconductor device 114. Referring to FIG. 1, a lateral extent of the package body 116 is less than that of the substrate unit 112, such that a peripheral portion of the upper surface 120 remains exposed. Extending between this peripheral portion and a lower surface 122 of the substrate unit 106 are solder balls, including solder balls 124a and 124b, which are initially part of the top package 102 and are reflowed during stacking operations to electrically connect the top package 102 to the bottom package 104. As illustrated in FIG. 1, the bottom package 104 also includes solder balls 126a, 126b, 126c, and 126d, which extend from a lower surface 128 of the substrate unit 112 and provide input and output electrical connections for the assembly 100.

While a higher density of the semiconductor devices 108 and 114 can be achieved for a given footprint area, the assembly 100 can suffer from a number of disadvantages. In particular, the relatively large solder balls, such as the solder balls 124a and 124b, spanning a distance between the top package 102 and the bottom package 104 take up valuable area on the upper surface 120 of the substrate unit 112, thereby hindering the ability to reduce a distance between adjacent ones of the solder balls as well as hindering the ability to increase a total number of the solder balls. Also, manufacturing of the assembly 100 can suffer from undesirably low stacking yields, as the solder balls 124a and 124b may not sufficiently adhere to the substrate unit 112 of the bottom package 104 during reflow. This inadequate adherence can be exacerbated by molding operations used to form the package body 116, as a molding material can be prone to overflowing onto and contaminating the peripheral portion of the upper surface 120. Moreover, because of the reduced lateral extent of the package body 116, the assembly 100 can be prone to bending or warping, which can create sufficient stresses on the solder balls 124a and 124b that lead to connection failure.

It is against this background that a need arose to develop the stackable semiconductor device packages and related stacked package assemblies and methods described herein.

SUMMARY

One aspect of the invention relates to manufacturing methods. In one embodiment, a manufacturing method includes: (1) providing a substrate including an upper surface and contact pads disposed adjacent to the upper surface of the substrate; (2) applying an electrically conductive material to the upper surface of the substrate to form conductive bumps disposed adjacent to respective ones of the contact pads; (3) electrically connecting a semiconductor device to the upper surface of the substrate; (4) applying a molding material to the upper surface of the substrate to form a molded structure covering the conductive bumps and the semiconductor device, the molded structure including a first upper surface, upper ends of the conductive bumps being disposed below the first upper surface of the molded structure; (5) forming a set of cutting slits extending partially through the molded structure and the conductive bumps to form truncated conductive bumps, the molded structure including a second upper surface that is disposed below the first upper surface of the molded structure, upper ends of the truncated conductive bumps being substantially aligned with the second upper surface of the molded structure; and (6) reflowing the truncated conductive bumps to form reflowed conductive bumps, upper ends of the reflowed conductive bumps protruding above the second upper surface of the molded structure.

In another embodiment, a manufacturing method includes: (1) providing a first semiconductor device package including (a) a substrate unit including an upper surface, (b) first connecting elements extending upwardly from the upper surface of the substrate unit, at least one of the first connecting elements having a height $H_C$, (c) a semiconductor device disposed adjacent to the upper surface of the substrate unit and electrically connected to the substrate unit, and (d) a package body disposed adjacent to the upper surface of the substrate unit and covering the semiconductor device, the package body having a first thickness $H_{P1}$ adjacent to the semiconductor device and a second thickness $H_{P2}$ adjacent to the first connecting elements, such that $H_{P2} < H_{P1}$, and $H_C > H_{P2}$; (2) providing a second semiconductor device package including a lower surface and second connecting elements extending downwardly from the lower surface of the second semiconductor device package; (3) positioning the second semiconductor device package with respect to the first semiconductor device package, such that the second connecting elements are adjacent to respective ones of the first connecting elements; and (4) merging respective pairs of the first connecting elements and the second connecting elements to form stacking elements electrically connecting the first semiconductor device package and the second semiconductor device package.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings. In the drawings, like reference numbers denote like elements, unless the context clearly dictates otherwise.

DETAILED DESCRIPTION

Definitions

Figure 1:
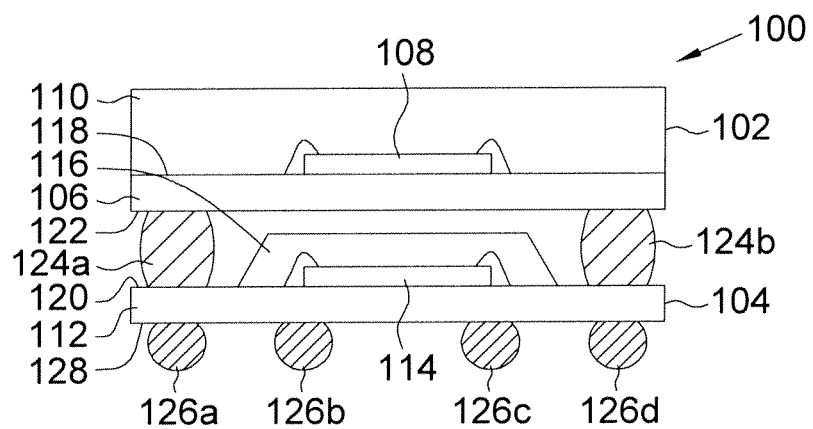
FIG. 1 illustrates a stacked package assembly implemented in accordance with a conventional approach.

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to a semiconductor device can include multiple semiconductor devices unless the context clearly dictates otherwise.

As used herein, the term "set" refers to a collection of one or more components. Thus, for example, a set of layers can include a single layer or multiple layers. Components of a set also can be referred as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another.

As used herein, relative terms, such as "inner," "interior," "outer," "exterior," "top," "bottom," "upper," "upwardly," "lower," "downwardly," "vertical," "vertically," "lateral," "laterally," "above," and "below," refer to an orientation of a set of components with respect to one another, such as in accordance with the drawings, but do not require a particular orientation of those components during manufacturing or use.

As used herein, the terms "connect," "connected," "connecting," and "connection" refer to an operational coupling or linking. Connected components can be directly coupled to one another or can be indirectly coupled to one another, such as via another set of components.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein.

As used herein, the term "substantially uniform" refers to being substantially invariant along a set of directions. In some instances, a characteristic can be referred as being substantially uniform along a set of directions if values of the characteristic, as measured along the set of directions, exhibit a standard deviation that is no greater than about 20 percent with respect to an average value, such as no greater than about 10 percent or no greater than about 5 percent.

As used herein, the terms "electrically conductive" and "electrical conductivity" refer to an ability to transport an electric current. Electrically conductive materials typically correspond to those materials that exhibit little or no opposition to flow of an electric current. One measure of electrical conductivity is in terms of Siemens per meter ("$S \cdot m^{-1}$"). Typically, an electrically conductive material is one having a conductivity greater than about $10^4 S \cdot m^{-1}$, such as at least about $10^5 \ S \cdot m^{-1}$ or at least about $10^6 \ S \cdot m^{-1}$. Electrical conductivity of a material can sometimes vary with temperature. Unless otherwise specified, electrical conductivity of a material is defined at room temperature.

Figure 2:
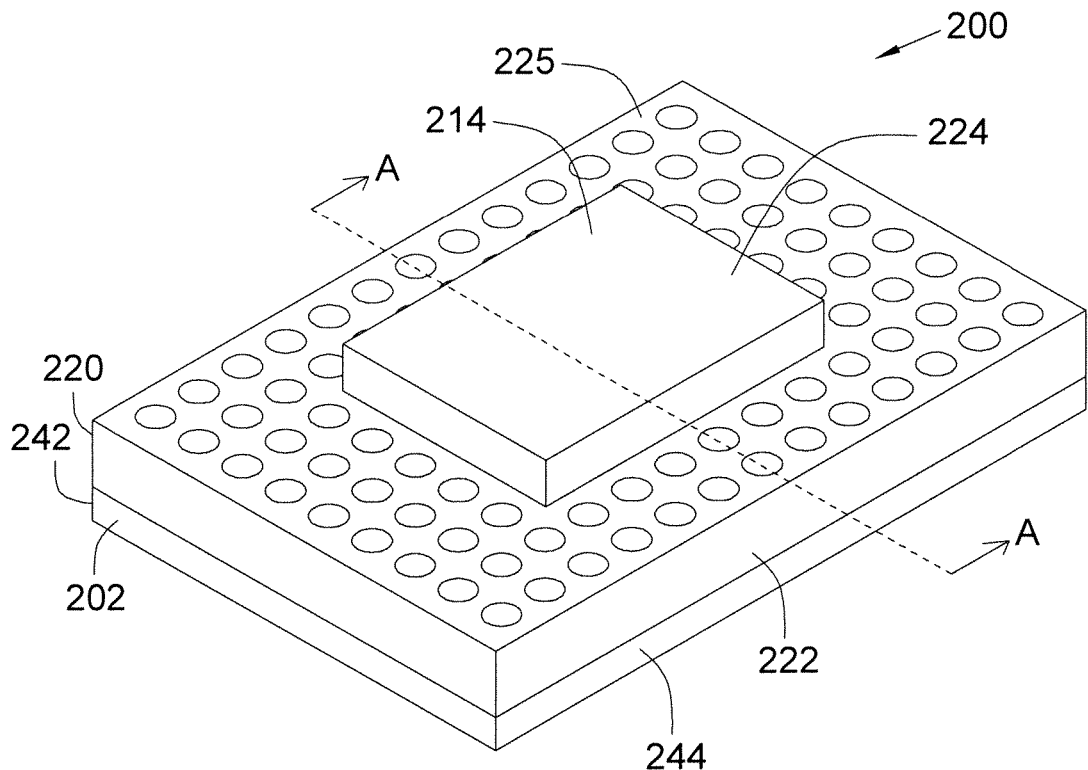
FIG. 2 illustrates a perspective view of a stackable semiconductor device package implemented in accordance with an embodiment of the invention.
Figure 3:
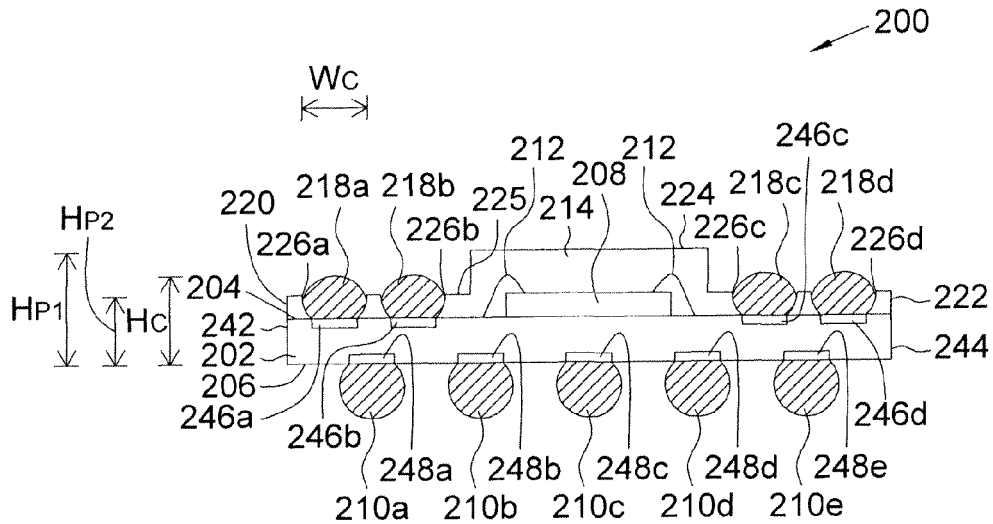
FIG. 3 illustrates a cross-sectional view of the package of FIG. 2, taken along line A-A of FIG. 2.

Attention first turns to FIG. 2 and FIG. 3, which illustrate a stackable semiconductor device package 200 implemented in accordance with an embodiment of the invention. In particular, FIG. 2 illustrates a perspective view of the package 200, while FIG. 3 illustrates a cross-sectional view of the package 200, taken along line A-A of FIG. 2.

Referring to FIG. 2 and FIG. 3, the package 200 includes a substrate unit 202, which includes an upper surface 204, a lower surface 206, and lateral surfaces, including lateral surfaces 242 and 244, which are disposed adjacent to sides of the substrate unit 202 and extend between the upper surface 204 and the lower surface 206. In the illustrated embodiment, the lateral surfaces 242 and 244 are substantially planar and have a substantially orthogonal orientation with respect to the upper surface 204 or the lower surface 206, although it is contemplated that the shapes and orientations of the lateral surfaces 242 and 244 can vary for other implementations. For certain implementations, a thickness of the substrate unit 202, namely a vertical distance between the upper surface 204 and the lower surface 206 of the substrate unit 202, can be in the range of about 0.1 millimeter ("mm") to about 2 mm, such as from about 0.2 mm to about 1.5 mm or from about 0.4 mm to about 0.6 mm.

The substrate unit 202 can be implemented in a number of ways, and includes electrical interconnect to provide electrical pathways between the upper surface 204 and the lower surface 206 of the substrate unit 202. As illustrated in FIG. 3, the substrate unit 202 includes contact pads 246a, 246b, 246c, and 246d, which are disposed adjacent to a peripheral portion of the upper surface 204, and contact pads 248a, 248b, 248c, 248d, and 248e, which are disposed adjacent to the lower surface 206. In the illustrated embodiment, the contact pads 246a, 246b, 246c, and 246d and the contact pads 248a, 248b, 248c, 248d, and 248e are implemented as conductive ball pads to allow mounting of conductive balls, although it is contemplated that their implementation can vary from that illustrated in FIG. 3. The contact pads 246a, 246b, 246c, and 246d are distributed in the form of rows extending within and along the sides of the substrate unit 202, while the contact pads 248a, 248b, 248c, 248d, and 248e are distributed in the form of an array. However, it is contemplated that the distribution of the contact pads 246a, 246b, 246c, and 246d and the contact pads 248a, 248b, 248c, 248d, and 248e can vary for other implementations. The contact pads 246a, 246b, 246c, and 246d and the contact pads 248a, 248b, 248c, 248d, and 248e are connected to other electrical interconnect included in the substrate unit 202, such as a set of electrically conductive layers that are incorporated within a set of dielectric layers. The electrically conductive layers can be connected to one another by internal vias, and can be implemented so as to sandwich a core formed from a suitable resin, such as one based on bismaleimide and triazine or based on epoxy and polyphenylene oxide. For example, the substrate unit 202 can include a substantially slab-shaped core that is sandwiched by one set of electrically conductive layers disposed adjacent to an upper surface of the core and another set of electrically conductive layers disposed adjacent to a lower surface of the core. While not illustrated in FIG. 3, it is contemplated that a solder mask layer can be disposed adjacent to either, or both, the upper surface 204 and the lower surface 206 of the substrate unit 202.

As illustrated in FIG. 3, the package 200 also includes connecting elements 218a, 218b, 218c, and 218d that are disposed adjacent to the peripheral portion of the upper surface 204. The connecting elements 218a, 218b, 218c, and 218d are electrically connected to and extend upwardly from respective ones of the contact pads 246a, 246b, 246c, and 246d and, accordingly, are distributed in the form of rows extending within and along the sides of the substrate unit 202. As further described below, the connecting elements 218a, 218b, 218c, and 218d provide electrical pathways between the package 200 and another package within a stacked package assembly. In the illustrated embodiment, the connecting elements 218a, 218b, 218c, and 218d are implemented as conductive balls and, more particularly, as conductive balls that are truncated and reflowed to form conductive bumps in accordance with manufacturing operations further described below. The connecting elements 218a, 218b, 218c, and 218d are formed from a metal, a metal alloy, a matrix with a metal or a metal alloy dispersed therein, or another suitable electrically conductive material. As illustrated in FIG. 3, a size of each connecting element 218a, 218b, 218c, or 218d can be specified in accordance with a height $H_C$ of the connecting element 218a, 218b, 218c, or 218d, namely a maximum vertical extent of the connecting element 218a, 218b, 218c, or 218d, and a width $W_C$ of the connecting element 218a, 218b, 218c, or 218d, namely a maximum lateral extent of the connecting element 218a, 218b, 218c, or 218d. For certain implementations, the height $H_C$ of each connecting element 218a, 218b, 218c, or 218d can be in the range of about 50 micrometer ("µm") to about 420 µm, such as from about 70 µm to about 370 µm or from about 120 µm to about 320 µm, and the width $W_C$ of each connecting element 218a, 218b, 218c, or 218d can be in the range of about 100 µm to about 500 µm, such as from about 150 µm to about 450 µm or from about 200 µm to about 400 µm.

Referring to FIG. 3, the package 200 also includes a semiconductor device 208, which is disposed adjacent to the upper surface 204 of the substrate unit 202, and connecting elements 210a, 210b, 210c, 210d, and 210e, which are disposed adjacent to the lower surface 206 of the substrate unit 202. In the illustrated embodiment, the semiconductor device 208 is a semiconductor chip, such as a processor or a memory device. The semiconductor device 208 is wire-bonded to the substrate unit 202 via a set of wires 212, which are formed from gold, copper, or another suitable electrically conductive material. For certain implementations, at least a subset of the wires 212 is desirably formed from copper, since, as compared to gold, copper has a superior electrical conductivity and a lower cost, while allowing the wires 212 to be formed with reduced diameters. The wires 212 can be coated with a suitable metal, such as palladium, as a protection against oxidation and other environmental conditions. It is also contemplated that the semiconductor device 208 can be electrically connected to the substrate unit 202 in another fashion, such as by flip chip-bonding. For example, the semiconductor device 208 can be flip chip-bonded to the substrate unit 202 via a set of conductive bumps, which are formed from solder, copper, nickel, or another suitable electrically conductive material. For certain implementations, at least a subset of the conductive bumps can be formed as a multi-layer bumping structure, including a copper post disposed adjacent to the semiconductor device 208, a solder layer disposed adjacent to the substrate unit 202, and a nickel barrier layer disposed between the copper post and the solder layer to suppress diffusion and loss of copper. Certain aspects of such a multi-layer bumping structure is described in the co-pending and co-owned U.S. Patent Application Publication No. 2006/0094224, the disclosure of which is incorporated herein by reference in its entirety. While the single semiconductor device 208 is illustrated in FIG. 3, it is contemplated that additional semiconductor devices can be included for other implementations, and that semiconductor devices, in general, can be any active devices, any passive devices, or combinations thereof. For example, it is contemplated that multiple semiconductor devices can be included in a stacked fashion within the package 200 to achieve an even higher density of semiconductor devices for a given footprint area.

Still referring to FIG. 3, the connecting elements 210a, 210b, 210c, 210d, and 210e provide input and output electrical connections for the package 200, and are electrically connected to and extend downwardly from respective ones of the contact pads 248a, 248b, 248c, 248d, and 248e. In the illustrated embodiment, the connecting elements 210a, 210b, 210c, 210d, and 210e are implemented as conductive balls and, more particularly, as conductive balls that are reflowed to form conductive bumps in accordance with manufacturing operations further described below. The connecting elements 210a, 210b, 210c, 210d, and 210e are formed from a metal, a metal alloy, a matrix with a metal or a metal alloy dispersed therein, or another suitable electrically conductive material. At least a subset of the connecting elements 210a, 210b, 210c, 210d, and 210e is electrically connected to the semiconductor device 208 via electrical interconnect included in the substrate unit 202, and at least the same or a different subset of the connecting elements 210a, 210b, 210c, 210d, and 210e is electrically connected to the connecting elements 218a, 218b, 218c, and 218d via electrical interconnect included in the substrate unit 202.

Referring to FIG. 2 and FIG. 3, the package 200 also includes a package body 214 that is disposed adjacent to the upper surface 204 of the substrate unit 202. In conjunction with the substrate unit 202, the package body 214 substantially covers or encapsulates the semiconductor device 208 and the wires 212 to provide structural rigidity as well as protection against oxidation, humidity, and other environmental conditions. Advantageously, the package body 214 extends to the sides of the substrate unit 202 and partially covers or encapsulates the connecting elements 218a, 218b, 218c, and 218d along the peripheral portion of the upper surface 204 so as to provide improved structural rigidity and reduced tendency towards bending or warping. In conjunction, the package body 214 is implemented so as to at least partially expose the connecting elements 218a, 218b, 218c, and 218d for stacking another package on top of the package 200.

The package body 214 is formed from a molding material, and includes a central upper surface 224, a peripheral upper surface 225, and lateral surfaces, including lateral surfaces 220 and 222, which are disposed adjacent to sides of the package body 214. In the illustrated embodiment, each of the central upper surface 224 and the peripheral upper surface 225 is substantially planar and has a substantially parallel orientation with respect to the upper surface 204 or the lower surface 206 of the substrate unit 202, although it is contemplated that the central upper surface 224 and the peripheral upper surface 225 can be curved, inclined, stepped, or roughly textured for other implementations. Referring to FIG. 2 and FIG. 3, the package body 214 has a reduced thickness adjacent to the sides of the package body 214 so as to at least partially expose the connecting elements 218a, 218b, 218c, and 218d. In particular, a central thickness $H_{P1}$ of the package body 214, namely a vertical distance between the central upper surface 224 of the package body 214 and the upper surface 204 of the substrate unit 202, is greater than a peripheral thickness $H_{P2}$ of the package body 214, namely a vertical distance between the peripheral upper surface 225 of the package body 214 and the upper surface 204 of the substrate unit 202, which, in turn, is substantially the same as or less than the height $H_C$ of each connecting element 218a, 218b, 218c, or 218d. More particularly, the central thickness $H_p$, can be greater than the height $H_C$, and the peripheral thickness $H_{P2}$ can be no greater than about ⅔ of the central thickness $H_{P1}$, such as from about 1/10 to about ⅔ of $H_{P1}$ or from about ¼ to about ½ of $H_{P1}$, although it is also contemplated that the peripheral thickness $H_{P2}$ can be greater than about ⅔ of $H_{P1}$, such as from about ⅔ to about 9/10 of $H_{P1}$. For certain implementations, the central thickness $H_{P1}$ of the package body 214 can be in the range of about 100 μm to about 600 μm, such as from about 150 μm to about 550 μm or from about 200 μm to about 500 μm, and the peripheral thickness $H_{P2}$ of the package body 214 can be in the range of about 50 μm to about 400 μm, such as from about 50 μm to about 350 μm or from about 100 μm to about 300 μm.

Disposed adjacent to the peripheral upper surface 225 and extending downwardly from the peripheral upper surface 225 are depressions, including depressions 226a, 226b, 226c, and 226d, which define apertures or openings corresponding to respective ones of the connecting elements 218a, 218b, 218c, and 218d. The openings at least partially expose the connecting elements 218a, 218b, 218c, and 218d for stacking another package on top of the package 200. Like the connecting elements 218a, 218b, 218c, and 218d, the openings are distributed in the form of rows, with each row extending along four sides of a substantially rectangular pattern or a substantially square-shaped pattern. While two rows of openings are illustrated in FIG. 2 and FIG. 3, it is contemplated that more or less rows of openings can be included for other implementations, and that openings, in general, can be distributed in any one-dimensional pattern or any two-dimensional pattern.

Referring to FIG. 2 and FIG. 3, the lateral surfaces 220 and 222 of the package body 214 are substantially planar and have a substantially orthogonal orientation with respect to the upper surface 204 or the lower surface 206 of the substrate unit 202, although it is contemplated that the lateral surfaces 220 and 222 can be curved, inclined, stepped, or roughly textured for other implementations. Also, the lateral surfaces 220 and 222 are substantially aligned or co-planar with the lateral surfaces 242 and 244 of the substrate unit 202, respectively, such that, in conjunction with the lateral surfaces 242 and 244, the lateral surfaces 220 and 222 define sides of the package 200. More particularly, this alignment is accomplished such that the package body 214 has a lateral extent that substantially corresponds to that of the substrate unit 202 (albeit with a reduced thickness adjacent to the sides of the package 200), thereby allowing the package body 214 to provide a more uniform coverage of the upper surface 204 and improved structural rigidity. For other implementations, it is contemplated that the shapes of the lateral surfaces 220 and 222 and their alignment with the lateral surfaces 242 and 244 can be varied from that illustrated in FIG. 2 and FIG. 3, while providing sufficient structural rigidity and allowing the connecting elements 218a, 218b, 218c, and 218d to be at least partially exposed.

Figure 4:
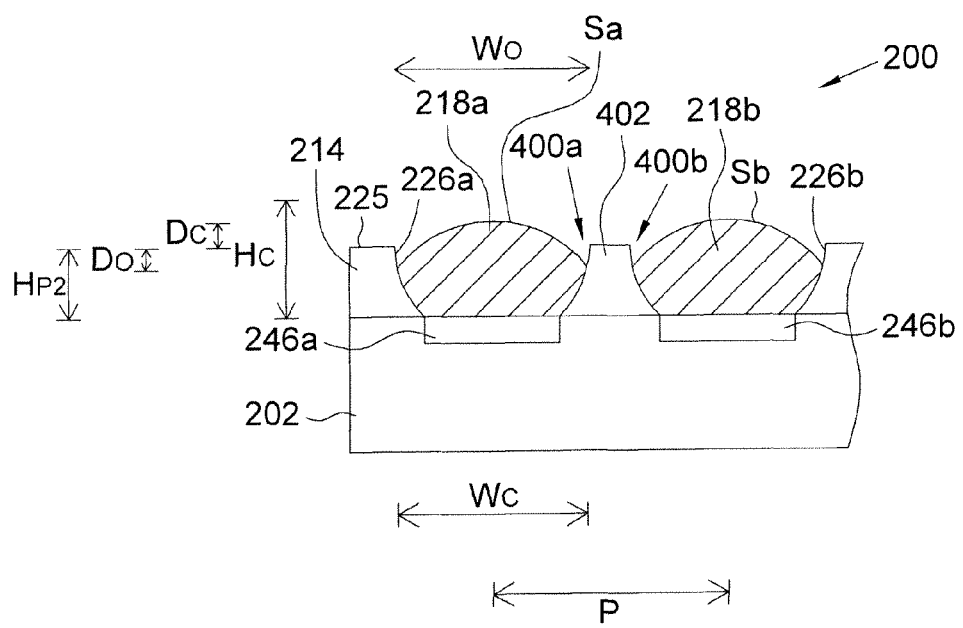
FIG. 4 illustrates an enlarged, cross-sectional view of a portion of the package of FIG. 2.

Attention next turns to FIG. 4, which illustrates an enlarged, cross-sectional view of a portion of the package 200 of FIG. 2 and FIG. 3. In particular, FIG. 4 illustrates a particular implementation of the package body 214 and the connecting elements 218a and 218b, while certain other details of the package 200 are omitted for ease of presentation.

As illustrated in FIG. 4, the package body 214 is formed with the depressions 226a and 226b, which define openings 400a and 400b that are sized to expose connection surfaces $S_a$ and $S_b$ of the connecting elements 218a and 218b. In the illustrated embodiment, a size of each opening 400a or 400b can be specified in accordance with a width and a depth of the opening 400a or 400b. A number of advantages can be achieved by suitable selection and control over shapes and sizes of the openings 400a and 400b, shapes and sizes of the connecting elements 218a and 218b, or a combination of these characteristics. In particular, by exposing the connection surfaces $S_a$ and $S_b$, the connecting elements 218a and 218b, in effect, can serve as a pre-solder for improved adherence and wetting with respect to connecting elements of another package when stacking that package on top of the package 200. Also, the relatively large areas of the connection surfaces $S_a$ and $S_b$ can enhance reliability and efficiency of electrical connections, thereby improving stacking yields. During stacking operations, the openings 400a and 400b can avoid or reduce instances of overflow of a conductive material during stacking operations, thereby allowing stacking elements to be formed with a reduced distance with respect to one another.

In the illustrated embodiment, an opening, such as the opening 400a or 400b, is shaped in the form of a circular cone or a circular funnel, including a substantially circular cross-section with a width that varies slightly along a vertical direction. In particular, a lateral boundary of an opening, such as defined by the depression 226a or 226b, slightly and gradually tapers towards a respective connecting element, such as the connecting element 218a or 218b, and contacts the connecting element to define a boundary between an uncovered, upper portion of the connecting element and a covered, lower portion of the connecting element. However, it is contemplated that the shape of an opening, in general, can be any of a number of shapes. For example, an opening can have another type of tapered shape, such as an elliptical cone shape, a square cone shape, or a rectangular cone shape; a non-tapered shape, such as a circular cylindrical shape, an elliptic cylindrical shape, a square cylindrical shape, or a rectangular cylindrical shape; or another regular or irregular shape. It is also contemplated that a lateral boundary of an opening, such as defined by the depression 226a or 226b, can be curved in a convex fashion, curved in a concave fashion, or roughly textured.

For certain implementations, a width $W_O$ of each opening 400a or 400b, namely a lateral extent adjacent to an upper end of the opening 400a or 400b and adjacent to the peripheral upper surface 225 of the package body 214, can be in the range of about 100 μm to about 520 μm, such as from about 150 μm to about 470 μm or from about 200 μm to about 420 μm. If the opening 400a or 400b has a non-uniform cross-sectional shape, the width $W_O$ can correspond to, for example, an average of lateral extents along orthogonal directions. Also, the width $W_C$ of each connecting element 218a or 218b corresponds to its lateral extent adjacent to a boundary between covered and uncovered portions of the connecting element 218a or 218b, and the width $W_O$ of each opening 400a or 400b can be substantially the same as or greater than the width $W_C$ of a respective connecting element 218a or 218b, with a ratio of the width $W_O$ and the width $W_C$ corresponding to an extent of tapering and represented as follows: $W_O = aW_C \geq W_C$, where a is in the range of about 1 to about 1.3, such as from about 1.02 to about 1.2 or from about 1.05 to about 1.1. Alternatively, or in conjunction, an upper bound for the width $W_O$ can be represented as follows: $P \geq W_O$, where P corresponds to a distance between centers of nearest-neighbor connecting elements, such as the connecting elements 218a and 218b, which distance is also sometimes referred as a connecting element pitch. For certain implementations, the connecting element pitch P can be in the range of about 300 μm to about 800 μm, such as from about 350 μm to about 650 μm or from about 400 μm to about 600 μm. By setting the upper bound for the width $W_O$ in such fashion, the openings 400a and 400b can be sufficiently sized, while retaining a lateral wall 402 that is disposed between the connecting elements 218a and 218b, as well as lateral walls between other connecting elements. The lateral wall 402 can serve as a barrier to avoid or reduce instances of overflow of an electrically conductive material during stacking operations, thereby allowing stacking elements to be formed with a reduced distance with respect to one another.

Still referring to FIG. 4, a connecting element, such as the connecting element 218a or 218b, is sized relative to the peripheral thickness $H_{P2}$ of the package body 214, such that an upper end of the connecting element protrudes above the peripheral upper surface 225 of the package body 214, namely such that the height $H_C$ of the connecting element is greater than the peripheral thickness $H_{P2}$ of the package body 214. More particularly, a difference between the height $H_C$ and the peripheral thickness $H_{P2}$ can be represented as follows: $H_C - H_{P2} = D_C$, where $D_C$ can be in the range of about 5 μm to about 120 μm, such as from about 10 μm to about 100 μM or from about 20 μm to about 70 μm. Advantageously, the protrusion of a connecting element above the peripheral upper surface 225 can ensure that the connecting element is at least partially exposed while accounting for typical tolerance levels of the peripheral thickness $H_{P2}$, thereby improving stacking yields. However, it is also contemplated that an upper end of a connecting element can be substantially aligned or co-planar with the peripheral upper surface 225 or can be recessed below the peripheral upper surface 225. As illustrated in FIG. 4, each opening 400a or 400b has a depth $D_O$ corresponding to a vertical distance between the peripheral upper surface 225 of the package body 214 and a boundary between covered and uncovered portions of a respective connecting element 218a or 218b. For certain implementations, the depth $D_O$ of each opening 400a or 400b can be in the range of about 5 μm to about 120 μm, such as from about 10 μm to about 100 μm or from about 20 μm to about 70 vtm. Alternatively, or in conjunction, the depth $D_O$ can be represented relative to the peripheral thickness $H_{P2}$ of the package body 214 as follows: $H_{P2} \geq D_O \geq bH_{P2}$, where b sets a lower bound for the depth $D_O$, and can be, for example, about 0.05, about 0.1, or about 0.2.

Figure 5:
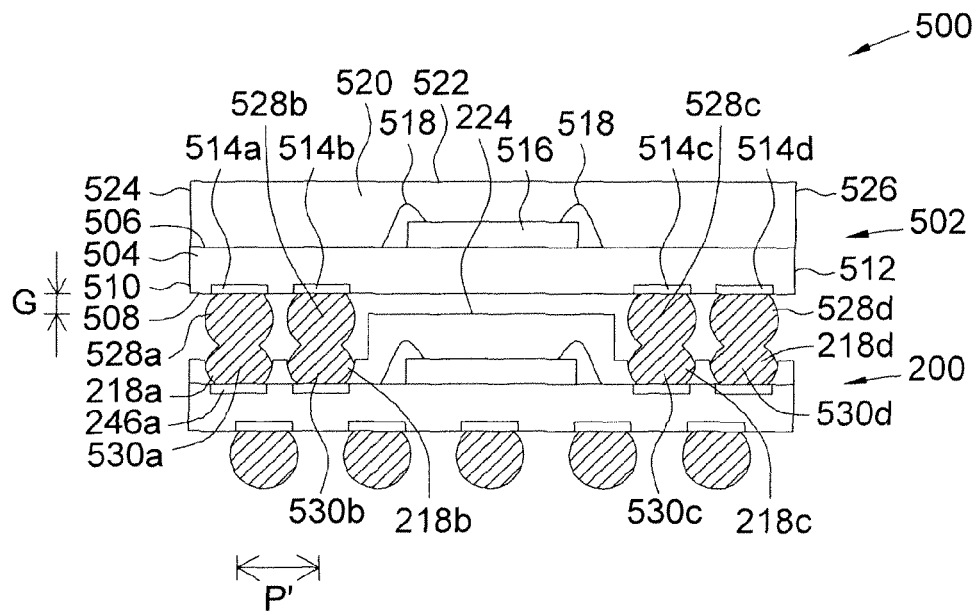
FIG. 5 illustrates a cross-sectional view of a stacked package assembly formed using the package of FIG. 2, according to an embodiment of the invention.

FIG. 5 illustrates a cross-sectional view of a stacked package assembly 500 implemented in accordance with an embodiment of the invention. In particular, FIG. 5 illustrates a particular implementation of the assembly 500 that is formed using the package 200 of FIG. 2 through FIG. 4.

As illustrated in FIG. 5, the assembly 500 includes a semiconductor device package 502, which corresponds to a top package that is disposed above and electrically connected to the package 200 that corresponds to a bottom package. In the illustrated embodiment, the package 502 is implemented as a ball grid array ("BGA") package, although it is contemplated that a number of other package types can be used, including a land grid array ("LGA") package, a quad flat no-lead ("QFN") package, an advanced QFN ("aQFN") package, and other types of BGA package, such as a window BGA package. While the two stacked packages 200 and 502 are illustrated in FIG. 5, it is contemplated that additional packages can be included for other implementations. Certain aspects of the package 502 can be implemented in a similar fashion as previously described for the package 200 and, thus, are not further described herein.

Referring to FIG. 5, the package 502 includes a substrate unit 504, which includes an upper surface 506, a lower surface 508, and lateral surfaces, including lateral surfaces 510 and 512, which are disposed adjacent to sides of the substrate unit 504 and extend between the upper surface 506 and the lower surface 508. The substrate unit 504 also includes contact pads 514a, 514b, 514c, and 514d, which are disposed adjacent to the lower surface 508. In the illustrated embodiment, the contact pads 514a, 514b, 514c, and 514d are implemented as conductive ball pads that are distributed in the form of rows, although it is contemplated that their implementation and distribution can vary from that illustrated in FIG. 5.

The package 502 also includes a semiconductor device 516, which is a semiconductor chip that is disposed adjacent to the upper surface 506 of the substrate unit 504. In the illustrated embodiment, the semiconductor device 516 is wire-bonded to the substrate unit 504 via a set of wires 518, although it is contemplated that the semiconductor device 516 can be electrically connected to the substrate unit 504 in another fashion, such as by flip chip-bonding. While the single semiconductor device 516 is illustrated within the package 502, it is contemplated that additional semiconductor devices can be included for other implementations.

Disposed adjacent to the upper surface 506 of the substrate unit 504 is a package body 520, which substantially covers or encapsulates the semiconductor device 516 and the wires 518 to provide structural rigidity as well as protection against environmental conditions. The package body 520 includes an upper surface 522 and lateral surfaces, including lateral surfaces 524 and 526, which are disposed adjacent to sides of the package body 520. In the illustrated embodiment, the lateral surfaces 524 and 526 are substantially aligned or co-planar with the lateral surfaces 510 and 512 of the substrate unit 504, respectively, such that, in conjunction with the lateral surfaces 510 and 512, the lateral surfaces 524 and 526 define sides of the package 502. Referring to FIG. 5, a lateral extent of the package 502 substantially corresponds to that of the package 200, although it is contemplated that the package 502 can be implemented with a greater or a smaller lateral extent relative to the package 200.

Referring to FIG. 5, the package 502 also includes connecting elements 528a, 528b, 528c, and 528d, which are disposed adjacent to the lower surface 508 of the substrate unit 504. The connecting elements 528a, 528b, 528c, and 528d provide input and output electrical connections for the package 502, and are electrically connected to and extend downwardly from respective ones of the contact pads 514a, 514b, 514c, and 514d. In the illustrated embodiment, the connecting elements 528a, 528b, 528c, and 528d are implemented as conductive balls and, more particularly, as conductive balls that are reflowed to form conductive bumps. Like the connecting elements 218a, 218b, 218c, and 218d, the connecting elements 528a, 528b, 528c, and 528d are distributed in the form of rows, with each row extending along four sides of a substantially rectangular pattern or a substantially square-shaped pattern.

During stacking operations, the connecting elements 528a, 528b, 528c, and 528d of the package 502 are reflowed and undergo metallurgical bonding with the connecting elements 218a, 218b, 218c, and 218d of the package 200. In particular, the connecting elements 528a, 528b, 528c, and 528d fuse or merge with respective ones of the connecting elements 218a, 218b, 218c, and 218d to form stacking elements 530a, 530b, 530c, and 530d, which provide electrical pathways between the packages 200 and 502. As illustrated in FIG. 5, each stacking element, such as the stacking element 530a, extends and spans a distance between the packages 200 and 502, such as corresponding to a vertical distance between the contact pad 246a of the package 200 and the contact pad 514a of the package 502. In conjunction, the stacking elements 530a, 530b, 530c, and 530d retain the packages 200 and 502 so as to be spaced apart from one another by a gap G, which corresponds to a vertical distance between the lower surface 508 of the package 502 and the central upper surface 224 of the package 200. For certain implementations, the gap G can be in the range of about 10 μm to about 110 μm, such as from about 10 μm to about 100 μm, from about 20 μm to about 80 μm, or from about 30 μm to about 70 μm. Suitable selection and control over sizes of the connecting elements 528a, 528b, 528c, and 528d and sizes of the connecting elements 218a, 218b, 218c, and 218d allow the gap G to be varied, and, in some implementations, the gap G can be reduced such that the lower surface 508 of the package 502 is in contact with the central upper surface 224 of the package 200.

A number of advantages can be achieved by stacking the packages 200 and 502 in the fashion illustrated in FIG. 5. In particular, because a pair of connecting elements, such as the connecting elements 218a and 528a, are included to span the distance between the packages 200 and 502, each of the pair of connecting elements can have a reduced size, relative to a conventional implementation using a single, relatively large solder ball to span that distance. And, a resulting stacking element, such as the stacking element 530a, can have a reduced lateral extent and can take up less valuable area, thereby allowing the ability to reduce a distance between adjacent stacking elements as well as the ability to increase a total number of stacking elements. In the illustrated embodiment, the distance between adjacent stacking elements can be specified in accordance with a stacking element pitch P', which corresponds to a distance between centers of nearest-neighbor stacking elements, such as the stacking elements 530a and 530b. For certain implementations, the stacking element pitch P' can substantially correspond to the connecting element pitch P, which was previously described with reference to FIG. 4. By suitable selection and control over sizes of the connecting elements 528a, 528b, 528c, and 528d and sizes of the connecting elements 218a, 218b, 218c, and 218d, the stacking element pitch P' can be reduced relative to a conventional implementation, and, in some implementations, the stacking element pitch P' (and the connecting element pitch P) can be in the range of about 300 μm to about 800 μm, such as from about 300 μm to about 500 μm or from about 300 μm to about 400 μm.

Certain aspects of stacking elements can be further appreciated with reference to FIG. 6A through FIG. 6D, which illustrate enlarged, cross-sectional views of a portion of the assembly 500 of FIG. 5. In particular, FIG. 6A through FIG. 6D illustrate particular implementations of the opening 400a and the stacking element 530a, while certain other details of the assembly 500 are omitted for ease of presentation.

As illustrated in FIG. 6A through FIG. 6D, the stacking element 530a is implemented as an elongated structure and, more particularly, as a conductive post that is formed as a result of fusing or merging of the connecting elements 218a and 528a. For certain implementations, the stacking element 530a is shaped in the form of a dumbbell, and includes an upper portion 600 and a lower portion 604, which are relatively larger than a middle portion 602 that is disposed between the upper portion 600 and the lower portion 604. However, it is contemplated that the shape of the stacking element 530a, in general, can be any of a number of shapes. The upper portion 600 substantially corresponds to, or is formed from, the connecting element 528a, the lower portion 604 substantially corresponds to, or is formed from, the connecting element 218a, and the middle portion 602 substantially corresponds to, or is formed from, an interface between the connecting elements 218a and 528a. As illustrated in FIG. 6A through FIG. 6D, a lateral boundary of the lower portion 604 is substantially covered or encapsulated by the package body 214, and lateral boundaries of the middle portion 602 and the upper portion 600 are substantially uncovered by the package body 214 so as to remain exposed. However, it is contemplated that the extent of coverage of the upper portion 600, the middle portion 602, and the lower portion 604 can be varied for other implementations.

Referring to FIG. 6A through FIG. 6D, a size of the stacking element 530a can be specified in accordance with its height $H_S$, namely a vertical extent of the stacking element 530a, a width $W_{SU}$ of the upper portion 600, namely a maximum lateral extent of the upper portion 600, a width $W_{SL}$ of the lower portion 604, namely a maximum lateral extent of the lower portion 604, and a width $W_{SM}$ of the middle portion 602, namely a minimum lateral extent of the middle portion 602. As can be appreciated, the height $H_S$ of the stacking element 530a can substantially correspond to a sum of the central thickness $H_{P1}$ of the package body 214 and the gap G between the packages 200 and 502, which were previously described with reference to FIG. 3 through FIG. 5, and, as illustrated in FIG. 6A through FIG. 6D, the stacking element 530a protrudes above the peripheral upper surface 225 of the package body 214 to an extent corresponding to a difference between the height $H_S$ and the peripheral thickness $H_{P2}$ of the package body 214. Also, the width $W_{SL}$ of the lower portion 604 can substantially correspond to the width $W_C$ of the connecting element 218a, which was previously described with reference to FIG. 3 and FIG. 4. In addition, the width $W_{SM}$ of the middle portion 602 can correspond to a minimum lateral extent of the stacking element 530a, and a ratio of the width $W_{SM}$ relative to the width $W_{SU}$ or the width $W_{SL}$ can correspond to an extent of inward tapering of the middle portion 602, relative to the upper portion 600 or the lower portion 604. For certain implementations, the width $W_{SM}$ can be represented relative to the smaller of the width $W_{su}$ and the width $W_{SL}$ as follows: $W_{SM} \geq c \times \min(W_{SU}, W_{SL})$, where c sets a lower bound on the extent of inward tapering and is less than or equal to 1.

The shape and size of the stacking element 530a can be controlled by suitable selection and control over the shape and size of the opening 400a, the shapes and sizes of the connecting elements 218a and 528a, manufacturing operations related to truncation and reflowing, or a combination of these characteristics or operations. In particular, it can be desirable to adjust the relative sizes of the upper portion 600 and the lower portion 604 in terms of a ratio of their widths $W_{SU}$ and $W_{SL}$, such as by selection and control over the relative sizes of the connecting elements 218a and 528a. Also, it can be desirable to adjust the extent of inward tapering of the middle portion 602, such as by selection and control over manufacturing operations related to truncation and reflowing. In particular, because excessive inward tapering can lead to cracking, reducing the extent of inward tapering can improve structural rigidity of the stacking element 530a, thereby enhancing reliability and efficiency of electrical connections between the packages 200 and 502.

Figure 6A:
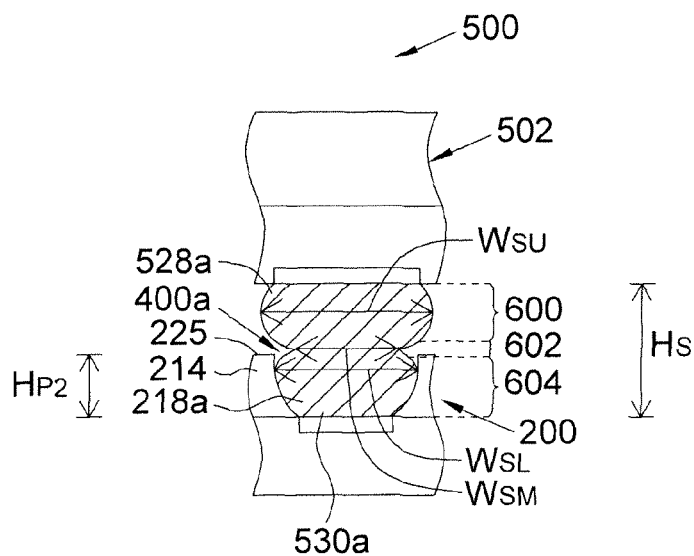
FIG. 6A through FIG. 6D illustrate enlarged, cross-sectional views of a portion of the assembly of FIG. 5.

In accordance with a first implementation of FIG. 6A, the width $W_{SU}$ is greater than the width $W_{SL}$, such as by sizing the connecting element 528a to be greater than the connecting element 218a. More particularly, a ratio of the width $W_{SU}$ and the width $W_{SL}$ can be represented as follows: $W_{SU}=dW_{SL}$, where d is in the range of about 1.05 to about 1.7, such as from about 1.1 to about 1.6 or from about 1.2 to about 1.5. In addition, suitable control over reflowing operations allows control over the extent of inward tapering. In particular, the width $W_{SM}$ can be represented as follows: $W_{SM} \geq c \times \min(W_{SU}, W_{SL})=cW_{SL}$, where c can be, for example, about 0.7, about 0.8, or about 0.9. It is also contemplated that the width $W_{SL}$ can be greater than the width $W_{SU}$, such as by sizing the connecting element 218a to be greater than the connecting element 528a, and that a ratio of the width $W_{sL}$ and the width $W_{SU}$ can be represented as follows: $W_{SL}=eW_{SU}$, where e is in the range of about 1.05 to about 1.7, such as from about 1.1 to about 1.6 or from about 1.2 to about 1.5. In the case that the width $W_{SL}$ is greater than the width $W_{SU}$, the width $W_{SM}$ can be represented as follows: $W_{SM} \geq c \times \min(W_{SU}, W_{SL})=cW_{SU}$, where c can be, for example, about 0.7, about 0.8, or about 0.9.

Figure 6B:
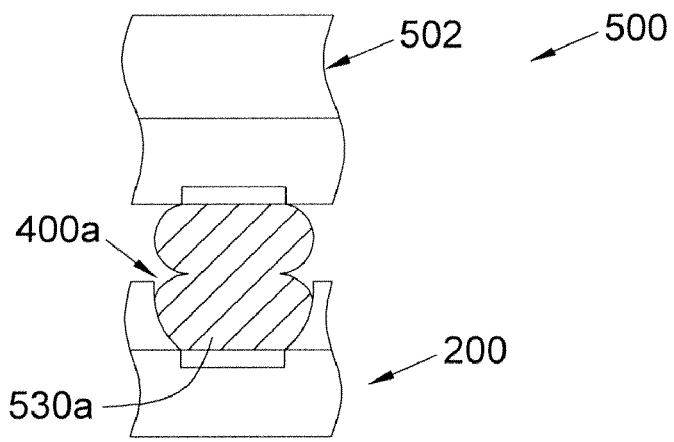

In accordance with a second implementation of FIG. 6B, the width $W_{su}$ is substantially the same as the width $W_{SL}$, such as by similarly sizing the connecting elements 218a and 528a. In addition, suitable control over reflowing operations allows control over the extent of inward tapering. In particular, the width $W_{SM}$ can be represented as follows: $W_{SM} \geq c \times \min(W_{SU}, W_{SL})=cW_{SU}=cW_{SL}$. Like the first implementation, c according to the second implementation can be, for example, about 0.7, about 0.8, or about 0.9.

Figure 6C:
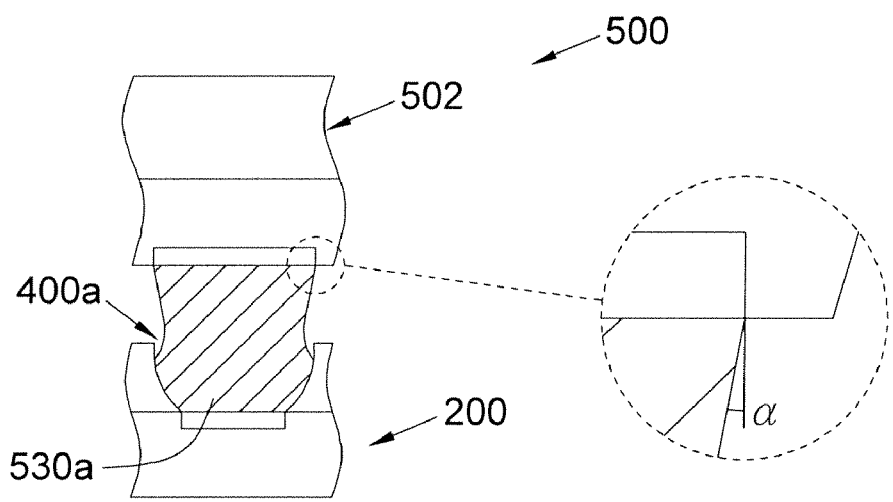

FIG. 6C illustrates a variation of the first implementation of FIG. 6A, in which the width $W_{SU}$ is greater than the width $W_{SL}$, such as by sizing the connecting element 528a to be greater than the connecting element 218a. However, by contrast, the extent of inward tapering of the middle portion 602 is reduced, and a lateral boundary of the stacking element 530a is tapered so as to gradually narrow from top to bottom. As illustrated in FIG. 6C, the lateral boundary of the stacking element 530a defines a taper angle α, where a is in the range of about 1° to about 45°, such as from about 2° to about 30° or from about 5° to about 20°. It also contemplated that the lateral boundary of the stacking element 530a can be tapered so as to gradually widen from top to bottom.

Figure 6D:
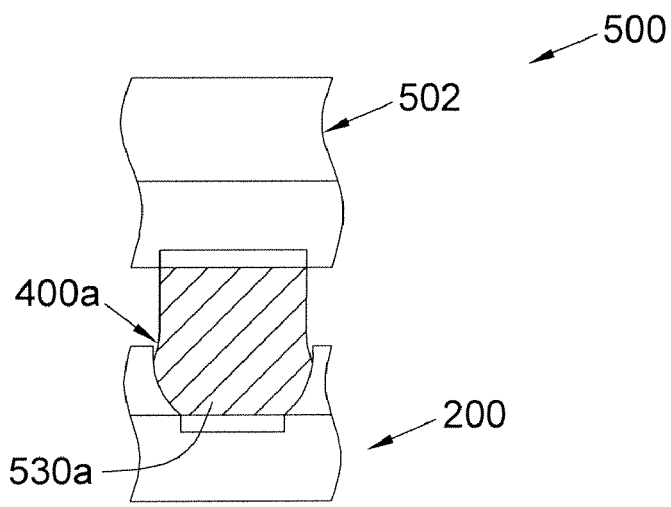

FIG. 6D illustrates a variation of the second implementation of FIG. 6B, in which the width $W_{SU}$ is substantially the same as the width $W_{SL}$, such as by similarly sizing the connecting elements 218a and 528a. However, by contrast, the extent of inward tapering of the middle portion 602 is reduced, such that the width $W_{SM}$ is substantially the same as the widths $W_{SU}$ and $W_{SL}$, and the stacking element 530a has a lateral boundary with a substantially orthogonal orientation and a lateral extent that is substantially uniform from top to bottom. As illustrated in FIG. 6D, the lateral extent of the stacking element 530a exhibits a standard deviation that is no greater than about 20 percent with respect to an average value, such as no greater than about 10 percent or no greater than about 5 percent.

FIG. 7A through FIG. 7H illustrate a manufacturing method of forming a stackable semiconductor device package and a stacked package assembly, according to an embodiment of the invention. For ease of presentation, the following manufacturing operations are described with reference to the package 200 of FIG. 2 through FIG. 4 and with reference to the assembly 500 of FIG. 5 through FIG. 6D. However, it is contemplated that the manufacturing operations can be similarly carried out to form other stackable semiconductor device packages and other stacked package assemblies.

Figure 7A:
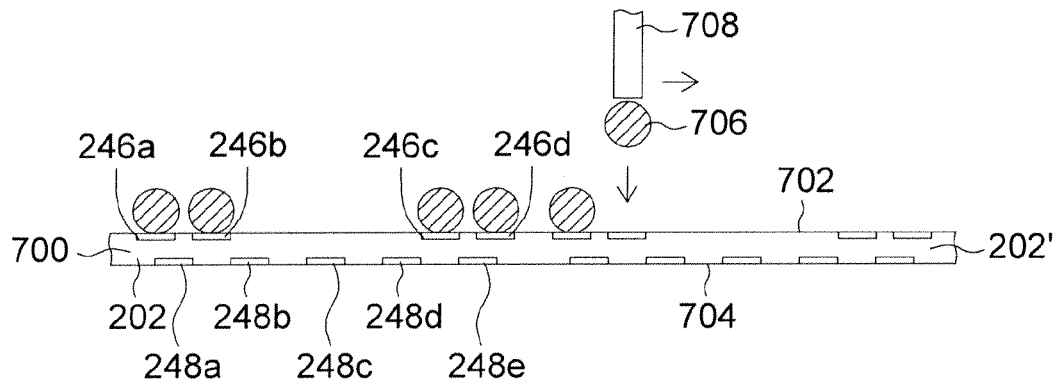
FIG. 7A through FIG. 7H illustrate a manufacturing method of forming the package of FIG. 2 and the assembly of FIG. 5, according to an embodiment of the invention.

Referring first to FIG. 7A, a substrate 700 is provided. To enhance manufacturing throughput, the substrate 700 includes multiple substrate units, including the substrate unit 202 and an adjacent substrate unit 202', thereby allowing certain of the manufacturing operations to be readily performed in parallel or sequentially. The substrate 700 can be implemented in a strip fashion, in which the multiple substrate units are arranged sequentially in an one-dimensional pattern, or in an array fashion, in which the multiple substrate units are arranged in a two-dimensional pattern. For ease of presentation, the following manufacturing operations are primarily described with reference to the substrate unit 202 and related components, although the manufacturing operations can be similarly carried for other substrate units and related components.

As illustrated in FIG. 7A, multiple contact pads are disposed adjacent to an upper surface 702 of the substrate 700, and multiple contact pads are disposed adjacent to a lower surface 704 of the substrate 700. In particular, the contact pads 246a, 246b, 246c, and 246d are disposed adjacent to the upper surface 702, while the contact pads 248a, 248b, 248c, 248d, and 248e are disposed adjacent to the lower surface 704. In the illustrated embodiment, conductive bumps are subsequently disposed adjacent to respective ones of the contact pads 246a, 246b, 246c, and 246d and the contact pads 248a, 248b, 248c, 248d, and 248e, which serve to electrically connect the conductive bumps to electrical interconnect included in the substrate 700. The contact pads 246a, 246b, 246c, and 246d and the contact pads 248a, 248b, 248c, 248d, and 248e can be formed in any of a number of ways, such as photolithography, chemical etching, laser ablation or drilling, or mechanical drilling to form openings, along with plating of the openings using a metal, a metal alloy, a matrix with a metal or a metal alloy dispersed therein, or another suitable electrically conductive material. While not illustrated in FIG. 7A, it is contemplated that a tape can be used to secure the lower surface 704 of the substrate 700 during subsequent operations. The tape can be implemented as a single-sided adhesive tape or a double-sided adhesive tape.

Once the substrate 700 is provided, an electrically conductive material 706 is applied to the upper surface 702 of the substrate 700 and disposed adjacent to the contact pads 246a, 246b, 246c, and 246d. The electrically conductive material 706 includes a metal, a metal alloy, a matrix with a metal or a metal alloy dispersed therein, or another suitable electrically conductive material. For example, the electrically conductive material 706 can include a solder, which can be formed from any of a number of fusible metal alloys having melting points in the range of about 90° C. to about 450° C. Examples of such fusible metal alloys include tin-lead alloys, copper-zinc alloys, copper-silver alloys, tin-silver-copper alloys, bismuth-containing alloys, indium-containing alloys, and antimony-containing alloys. As another example, the electrically conductive material 706 can include a solid core formed from a metal, a metal alloy, or a resin, which solid core can be coated with a solder. As a further example, the electrically conductive material 706 can include an electrically conductive adhesive, which can be formed from any of a number of resins having an electrically conductive filler dispersed therein. Examples of suitable resins include epoxy-based resins and silicone-based resins, and examples of suitable fillers include silver fillers and carbon fillers.

In the illustrated embodiment, a dispenser 708 is laterally positioned with respect to the substrate 700 and is used to apply the electrically conductive material 706. In particular, the dispenser 708 is substantially aligned with the contact pads 246a, 246b, 246c, and 246d, thereby allowing the electrically conductive material 706 to be selectively applied to the contact pads 246a, 246b, 246c, and 246d. While the single dispenser 708 is illustrated in FIG. 7A, it is contemplated that multiple dispersers can be used to further enhance manufacturing throughput. Still referring to FIG. 7A, the dispenser 708 is a ball placement tool that deposits the electrically conductive material 706 in the form of conductive balls each having a substantially spherical or substantially spheroidal shape, although it is contemplated that the shapes of the conductive balls can vary for other implementations.

Figure 7B:
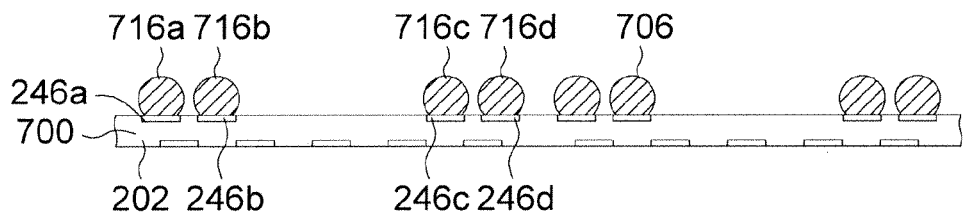

Once applied, the electrically conductive material 706 is reflowed, such as by raising the temperature to near or above a melting point of the electrically conductive material 706. As a result of gravity and other effects, the electrically conductive material 706 is drawn downwardly towards the contact pads 246a, 246b, 246c, and 246d, as illustrated in FIG. 7B, thereby enhancing reliability and efficiency of electrical connections with the contact pads 246a, 246b, 246c, and 246d. Once sufficiently reflowed, the electrically conductive material 706 is hardened or solidified, such as by lowering the temperature to below the melting point of the electrically conductive material 706. This solidification operation forms conductive bumps 716a, 716b, 716c, and 716d, which substantially retain their initial spherical or spheroidal shapes and are disposed adjacent to respective ones of the contact pads 246a, 246b, 246c, and 246d.

Figure 7C:
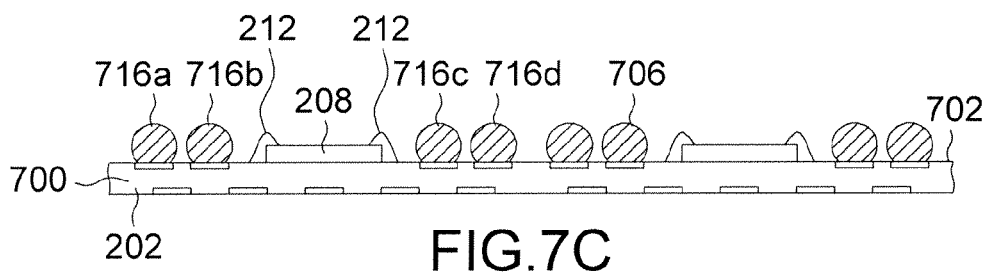

Next, as illustrated in FIG. 7C, the semiconductor device 208 is disposed adjacent to the upper surface 702 of the substrate 700, and is electrically connected to the substrate unit 202. In particular, the semiconductor device 208 is wire-bonded to the substrate unit 202 via the wires 212. It is contemplated that the ordering of operations by which the conductive bumps 716a, 716b, 716c, and 716d and the semiconductor device 208 are disposed adjacent to the substrate 700 can be varied for other implementations. For example, the semiconductor device 208 can be disposed adjacent to the substrate 700, and, subsequently, the electrically conductive material 706 can be applied to the substrate 700 to form the conductive bumps 716a, 716b, 716c, and 716d.

Figure 7D:
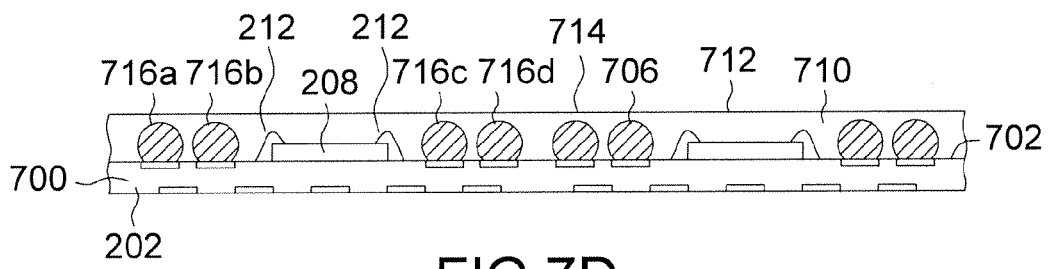

Referring next to FIG. 7D, a molding material 710 is applied to the upper surface 702 of the substrate 700 so as to substantially cover or encapsulate the conductive bumps 716a, 716b, 716c, and 716d, the semiconductor device 208, and the wires 212. In particular, the molding material 710 is applied across substantially an entire area of the upper surface 702, thereby providing improved structural rigidity and avoiding or reducing issues related to overflowing and contamination for a conventional implementation. Also, manufacturing cost is reduced by simplifying molding operations as well as reducing the number of those molding operations. The molding material 710 can include, for example, a Novolac-based resin, an epoxy-based resin, a silicone-based resin, or another suitable encapsulant. Suitable fillers also can be included, such as powdered $SiO_2$. The molding material 710 can be applied using any of a number of molding techniques, such as compression molding, injection molding, and transfer molding. Once applied, the molding material 710 is hardened or solidified, such as by lowering the temperature to below a melting point of the molding material 710, thereby forming a molded structure 712. To facilitate proper positioning of the substrate 700 during subsequent operations, fiducial marks can be formed in the molded structure 712, such as using laser marking. Alternatively, or in conjunction, fiducial marks can be formed adjacent to a periphery of the substrate 700.

Figure 7E:
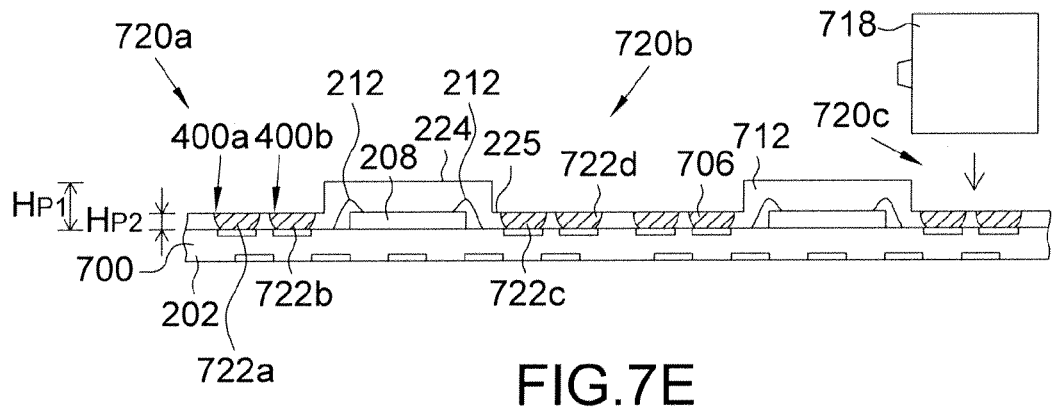

Next, referring to FIG. 7D and FIG. 7E, a thickness of the molded structure 712 adjacent to the conductive bumps 716a, 716b, 716c, and 716d is reduced from $H_{P1}$ to $H_{P2}$ by a thickness-reduction operation, such as laser ablation; mechanical cutting, routing, or grinding; chemical etching; or other removal technique, while a thickness of the molded structure 712 adjacent to the semiconductor device 208 and the wires 212 is substantially retained at $H_{P1}$. As illustrated in FIG. 7D and FIG. 7E, the thickness-reduction operation is a half-cutting operation that is carried out using a cutting tool 718, which forms cutting slits or trenches, including cutting slits 720a, 720b, and 720c. In particular, the cutting slits extend downwardly and partially through the molded structure 712 and the conductive bumps 716a, 716b, 716c, and 716d. In the illustrated embodiment, surfaces exposed or formed using the cutting tool 718, such as the peripheral upper surface 225, have a greater extent of surface roughness or texturing relative to surfaces not subjected to the cutting tool 718, such as the central upper surface 224. The alignment of the cutting tool 718 during the thickness-reduction operation can be aided by fiducial marks, which allow proper positioning of the cutting tool 718 when forming the cutting slits. It is also contemplated that a variation in the thickness of the molded structure 712 can be achieved through a suitable molding technique in place of, or in conjunction with, a removal technique.

As a result of the thickness-reduction operation, openings, including the openings 400a and 400b, are formed in the molded structure 712, and a particular volume or weight percentage of each conductive bump is removed, such as from about 10 percent to about 90 percent, from about 30 percent to about 70 percent, or from about 40 percent to about 60 percent by volume or by weight. In such fashion, truncated conductive bumps 722a, 722b, 722c, and 722d are formed with their upper ends being substantially planar and substantially aligned or co-planar with the peripheral upper surface 225. Still referring to FIG. 7E, each of the truncated conductive bumps 722a, 722b, 722c, and 722d has a substantially hemispherical shape, although it is contemplated that the shapes of the truncated conductive bumps 722a, 722b, 722c, and 722d can vary for other implementations.

Figure 7F:
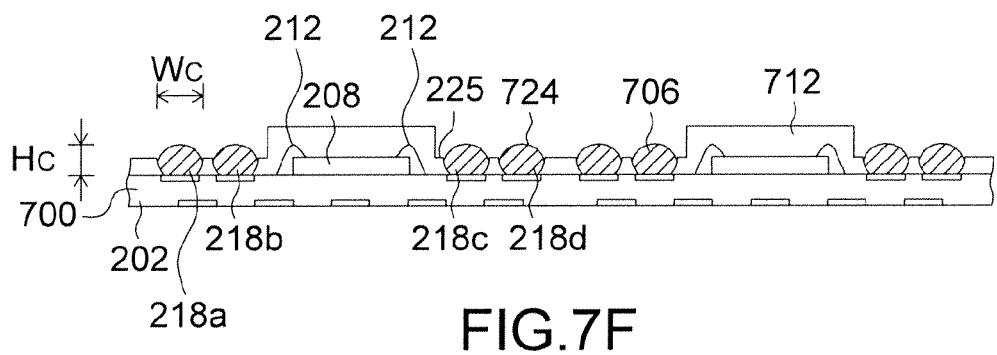

Next, referring to FIG. 7E and FIG. 7F, a flux material 724 is applied to the upper ends of the truncated conductive bumps 722a, 722b, 722c, and 722d through the openings formed in the molded structure 712. The flux material 724 can be any of a number of soldering agents to facilitate metallurgical bonding and to improve flow and wetting characteristics of the electrically conductive material 706. Examples of such soldering agents include those based on, or derived from, ammonium chloride, potassium chloride, sodium borate, sodium chloride, sodium fluoride, and zinc chloride. The flux material 724 can be selectively applied to the upper ends of the truncated conductive bumps 722a, 722b, 722c, and 722d, such as using a screen-printing technique, although it is also contemplated that the flux material 724 can be more generally applied to exposed surfaces, with excess material removed using cleaning operations.

Once the flux material 724 is applied, the truncated conductive bumps 722a, 722b, 722c, and 722d are reflowed, such as by raising the temperature to near or above a melting point of the electrically conductive material 706. As a result of cohesion and surface tension effects as suitably modified by the flux material 724, the truncated conductive bumps 722a, 722b, 722c, and 722d undergo a change from their initial hemispherical shapes into substantially dome-like shapes. Once sufficiently reflowed, the electrically conductive material 706 is hardened or solidified, such as by lowering the temperature to below the melting point of the electrically conductive material 706. As a result, the connecting elements 218a, 218b, 218c, and 218d are formed as reflowed conductive bumps, with upper ends that are curved or rounded and protruding above the peripheral upper surface 225. A number of advantages can be achieved by forming the connecting elements 218a, 218b, 218c, and 218d in the fashion illustrated in FIG. 7F. In particular, the height $H_C$ of a resulting connecting element, such as the connecting element 218a, can be enhanced to promote contact and metallurgical bonding with a connecting element of another package during stacking operations. At the same time, the width $W_C$ of the resulting connecting element can be controlled and reduced, relative to an implementation that deposits a single, relatively large conductive ball to achieve the enhanced height $H_C$. In such manner, the resulting connecting element can have a reduced lateral extent and can take up less valuable area, thereby allowing the ability to reduce a distance between adjacent connecting elements as well as the ability to increase a total number of connecting elements. It is also contemplated that the operation of applying the flux material 724 can be omitted for other implementations, although the extent of rounding and protrusion of the connecting elements 218a, 218b, 218c, and 218d can be less pronounced in the absence of the flux material 724.

Figure 7G:
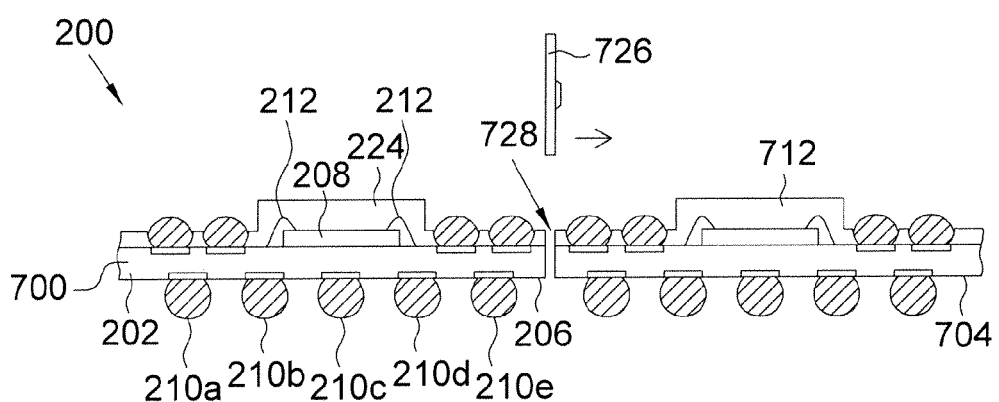

Next, as illustrated in FIG. 7G, singulation is carried out with respect to the molded structure 712. Such manner of singulation can be referred as "front-side" singulation. However, it is contemplated that singulation can be carried out with respect to the lower surface 704 of the substrate 700, and can be referred as "back-side" singulation. Referring to FIG. 7G, the "front-side" singulation is carried out using a saw 726, which forms cutting slits or trenches, including a cutting slit 728. In particular, the cutting slits extend downwardly and completely through the substrate 700 and the molded structure 712, thereby sub-dividing the substrate 700 and the molded structure 712 into discrete units, including the substrate unit 202 and the package body 214. The alignment of the saw 726 during the "front-side" singulation can be aided by fiducial marks, which allow proper positioning of the saw 726 when forming the cutting slits.

Still referring to FIG. 7G, the connecting elements 210a, 210b, 210c, 210d, and 210e are disposed adjacent to the lower surface 206 of the substrate unit 202. In such manner, the package 200 is formed. The connecting elements 210a, 210b, 210c, 210d, and 210e can be formed by, for example, applying an electrically conductive material and reflowing and solidifying that material to form conductive bumps. The connecting elements 210a, 210b, 210c, 210d, and 210e can be disposed adjacent to the lower surface 206 of the substrate unit 202 prior to or subsequent to the "front-side" singulation.

Figure 7H:
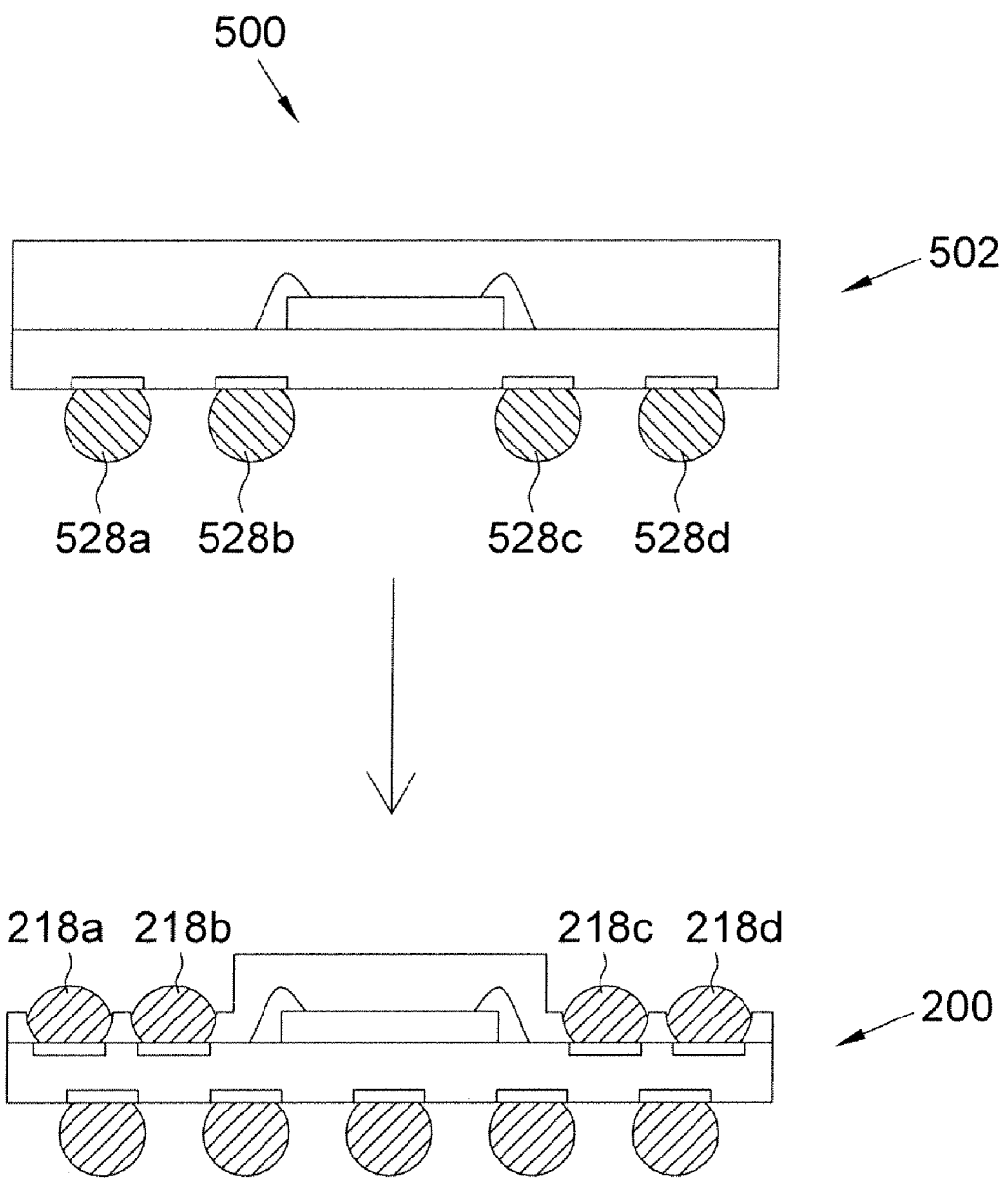

Stacking is next carried out with respect to the package 502 to form the assembly 500, as illustrated in FIG. 5 and FIG. 7H. In particular, the package 502 is positioned with respect to the package 200, such that the connecting elements 528a, 528b, 528c, and 528d of the package 502 are substantially aligned with and adjacent to respective ones of the connecting elements 218a, 218b, 218c, and 218d of the package 200. Once the packages 200 and 502 are positioned in such fashion, the connecting elements 218a, 218b, 218c, and 218d and the connecting elements 528a, 528b, 528c, and 528d are reflowed and solidified, such that metallurgical bonding takes place to form the stacking elements 530a, 530b, 530c, and 530d.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A manufacturing method, comprising:
    providing a substrate including an upper surface and contact pads disposed adjacent to the upper surface of the substrate;
    applying an electrically conductive material to the upper surface of the substrate to form conductive bumps disposed adjacent to respective ones of the contact pads;
    electrically connecting a semiconductor device to the upper surface of the substrate;
    applying a molding material to the upper surface of the substrate to form a molded structure covering the conductive bumps and the semiconductor device, the molded structure including a first upper surface, upper ends of the conductive bumps being disposed below the first upper surface of the molded structure;
    forming a set of cutting slits extending partially through the molded structure and the conductive bumps to form truncated conductive bumps, the molded structure including a second upper surface that is disposed below the first upper surface of the molded structure, upper ends of the truncated conductive bumps being substantially aligned with the second upper surface of the molded structure; and
    reflowing the truncated conductive bumps to form reflowed conductive bumps, upper ends of the reflowed conductive bumps protruding above the second upper surface of the molded structure.

2. The manufacturing method of claim 1, wherein the molded structure has a first thickness $H_{P1}$ corresponding to the first upper surface of the molded structure and a second thickness $H_{P2}$ corresponding to the second upper surface of the molded structure, and $H_{P2}<H_{P1}$.

3. The manufacturing method of claim 2, wherein $H_{P2}$ is in the range of 1/10 to 2/3 of $H_{P1}$.

4. The manufacturing method of claim 3, wherein $H_{P2}$ is in the range of 1/4 to 1/2 of $H_{P1}$.

5. The manufacturing method of claim 2, wherein at least one of the reflowed conductive bumps has a height $H_C$, and $H_C>H_{P2}$.

6. The manufacturing method of claim 5, wherein $H_C-H_{P2}=D_C$, and $D_C$ is in the range of 5 μm to 120 μm.

7. The manufacturing method of claim 6, wherein $D_C$ is in the range of 10 μm to 100 μm.

8. The manufacturing method of claim 1, further comprising applying a flux material to the upper ends of the truncated conductive bumps.

9. The manufacturing method of claim 8, wherein applying the flux material is carried out prior to reflowing the truncated conductive bumps.

10. The manufacturing method of claim 1, wherein the set of cutting slits corresponds to a first set of cutting slits, and the manufacturing method further comprises forming a second set of cutting slits extending through the molded structure and the substrate to form a first semiconductor device package.

11. The manufacturing method of claim 10, further comprising stacking a second semiconductor device package above the first semiconductor device package to form a stacked package assembly.

12. A manufacturing method, comprising:
providing a first semiconductor device package including
a substrate unit including an upper surface,
first connecting elements extending upwardly from the upper surface of the substrate unit, at least one of the first connecting elements having a height $H_C$,
a semiconductor device disposed adjacent to the upper surface of the substrate unit and electrically connected to the substrate unit, and
a package body disposed adjacent to the upper surface of the substrate unit and covering the semiconductor device, the package body having a first thickness $H_{P1}$ adjacent to the semiconductor device and a second thickness $H_{P2}$ adjacent to the first connecting elements, such that $H_{P2}<H_{P1}$, and $H_C>H_{P2}$;
providing a second semiconductor device package including a lower surface and second connecting elements extending downwardly from the lower surface of the second semiconductor device package;
positioning the second semiconductor device package with respect to the first semiconductor device package, such that the second connecting elements are adjacent to respective ones of the first connecting elements; and
merging respective pairs of the first connecting elements and the second connecting elements to form stacking elements electrically connecting the first semiconductor device package and the second semiconductor device package.

13. The manufacturing method of claim 12, wherein $H_{P2}<H_C<H_{P1}$.

14. The manufacturing method of claim 12, wherein the package body has a first upper surface corresponding to $H_{P1}$ and a second upper surface corresponding to $H_{P2}$, the package body defines openings disposed adjacent to the second upper surface of the package body, and the openings at least partially expose respective ones of the first connecting elements.

15. The manufacturing method of claim 14, wherein at least one of the first connecting elements has a width $W_C$, and at least one of the openings has a width $W_O$ adjacent to the second upper surface of the package body, such that $W_O \geq W_C$.

16. The manufacturing method of claim 15, wherein $W_O>W_C$.

17. The manufacturing method of claim 12, wherein at least one of the stacking elements includes:
a lower portion disposed adjacent to the upper surface of the substrate unit and having a width $W_{SL}$;
an upper portion disposed adjacent to the lower surface of the second semiconductor device package and having a width $W_{SU}$; and
a middle portion disposed between the upper portion and the lower portion and having a width $W_{SM}$.

18. The manufacturing method of claim 17, wherein $W_{SU} \geq W_{SL}$.

19. The manufacturing method of claim 17, wherein $W_{SL}=eW_{SU}$, and e is in the range of 1.05 to 1.7.

20. The manufacturing method of claim 17, wherein $W_{SM} \geq 0.7 \times \min(W_{SU}, W_{SL})$.

* * * * *